(12) United States Patent
Kim

(10) Patent No.: US 7,632,731 B2
(45) Date of Patent: Dec. 15, 2009

(54) SEMICONDUCTOR DEVICE AND METHOD FOR FABRICATING THE SAME

(75) Inventor: Dae Young Kim, Asan-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 138 days.

(21) Appl. No.: 11/645,545

(22) Filed: Dec. 27, 2006

(65) Prior Publication Data

US 2007/0166932 A1    Jul. 19, 2007

(30) Foreign Application Priority Data

Dec. 28, 2005    (KR) .................. 10-2005-0132702

(51) Int. Cl.
*H01L 21/8238* (2006.01)

(52) U.S. Cl. .................. 438/216; 438/287; 438/585; 257/411; 257/E21.625

(58) Field of Classification Search .................. 438/216, 438/287, 585, 591, 787, 788, 791, 792, 761, 438/763; 257/E21.625, E21.639, E29.132
See application file for complete search history.

(56) References Cited

U.S. PATENT DOCUMENTS

| 6,660,657 | B1 * | 12/2003 | Sandhu et al. | 438/775 |
| 6,858,524 | B2 * | 2/2005 | Haukka et al. | 438/585 |
| 2005/0045967 | A1 * | 3/2005 | Sasaki et al. | 257/406 |
| 2005/0205948 | A1 * | 9/2005 | Rotondaro et al. | 257/411 |
| 2006/0051925 | A1 * | 3/2006 | Ahn et al. | 438/287 |
| 2006/0148179 | A1 * | 7/2006 | Wang et al. | 438/287 |
| 2008/0026553 | A1 * | 1/2008 | Chua et al. | 438/591 |
| 2008/0093639 | A1 * | 4/2008 | Kim | 257/288 |

* cited by examiner

*Primary Examiner*—Ha Tran T Nguyen
*Assistant Examiner*—Daniel Whalen
(74) *Attorney, Agent, or Firm*—Finnegan, Henderson, Farabow, Garrett & Dunner, L.L.P.

(57) ABSTRACT

A method of fabricating a semiconductor device consistent with the present invention, the method comprising: forming an insulation film on a substrate; forming a mono-atomic layer of barrier ions at the insulation film; forming a gate insulation film in which the barrier ions are stabilized by an annealing process; forming a gate electrode on the gate insulation film; forming a spacer at a side surface of the gate electrode; and forming source/drain impurity regions at a side surface of the gate electrode.

6 Claims, 2 Drawing Sheets

SEMICONDUCTOR DEVICE AND METHOD FOR FABRICATING THE SAME

RELATED APPLICATION

This application claims the benefit of priority to Korean Patent Application No. 10-2005-0132702, filed on Dec. 28, 2005, which is incorporated herein by reference in its entirety.

BACKGROUND

1. Technical Field

The present invention relates to a semiconductor device and a method for fabricating the same.

2. Description of the Related Art

Generally, in order to drive PMOS in a CMOS device, impurity B+ ions implanted inside a poly-silicon forming a gate electrode are moved in a channel direction by applying a bias to the gate electrode.

The moved B+ ions cohere around a boundary of a gate oxide film, negatively influencing a drive of a device. Threshold voltage Vth shift and carrier mobility deterioration are examples of negative influence.

Conventionally, an NO anneal process or a plasma nitrification process progresses after a formation of the gate oxide film to prevent B+ ions from penetrating into the gate oxide film.

However, when a nitride oxide (NO) anneal process progresses, N ions are trapped in the gate oxide film, deteriorating mobility.

Further, when a plasma nitrification process progresses, there is a risk of damage to the gate oxide film by plasma from the process.

SUMMARY

Accordingly, an embodiment consistent with the present invention provides a semiconductor device and a method for fabricating the same, which prevents channel mobility deterioration and plasma damage.

An embodiment consistent with the present invention provides a semiconductor device comprising: a semiconductor substrate; a gate insulation film including an oxide film formed on the semiconductor substrate and nitride ions formed at a surface of the oxide film; a gate electrode formed on the gate insulation film; a spacer formed at a side surface of the gate electrode; and source/drain impurity regions formed at a side surface of the gate electrode.

Another embodiment consistent with the present invention provides a method of fabricating a semiconductor device, the method comprising: forming an insulation film on a semiconductor substrate; forming barrier ions at the insulation film as a single atom layer; forming a gate insulation film in which the barrier ions are stabilized by an annealing process; forming a gate electrode on the gate insulation film; forming a spacer at a side surface of the gate electrode; and forming source/drain impurity regions at a side surface of the gate electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Reference will now be made in detail to embodiments consistent with the present invention, examples of which are illustrated in the accompanying drawings. Wherever possible, the same reference numbers will be used throughout the drawings to refer to the same or like parts.

Hereinafter, a semiconductor device and a method for fabricating the semiconductor device will be described with reference to the accompanying drawings.

Figure 1:
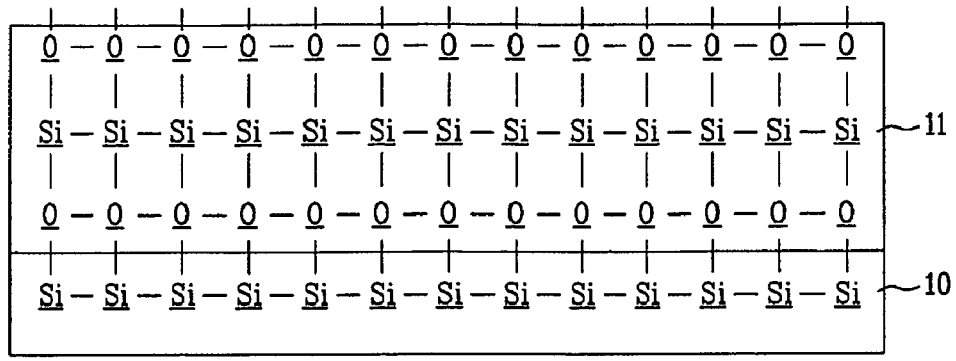
FIGS. 1 through 3 are cross-sectional views of a semiconductor device for illustrating a method of forming a gate of the semiconductor device consistent with an embodiment of the present invention.
Figure 2:
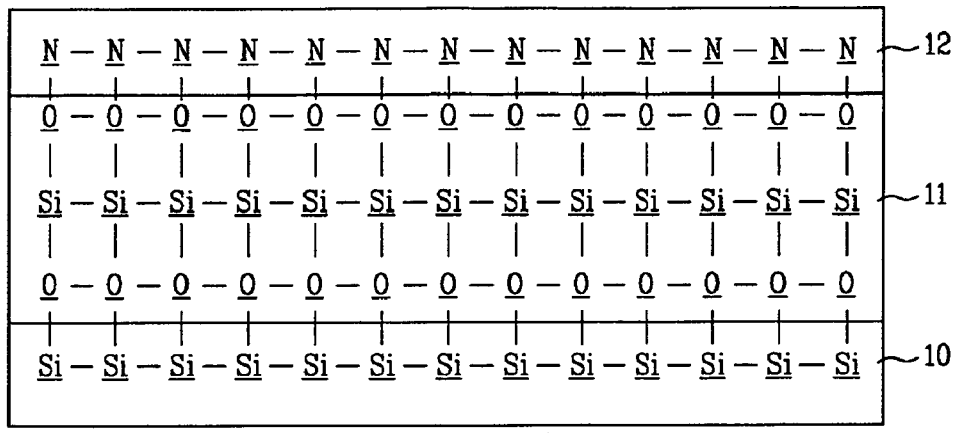
Figure 3:
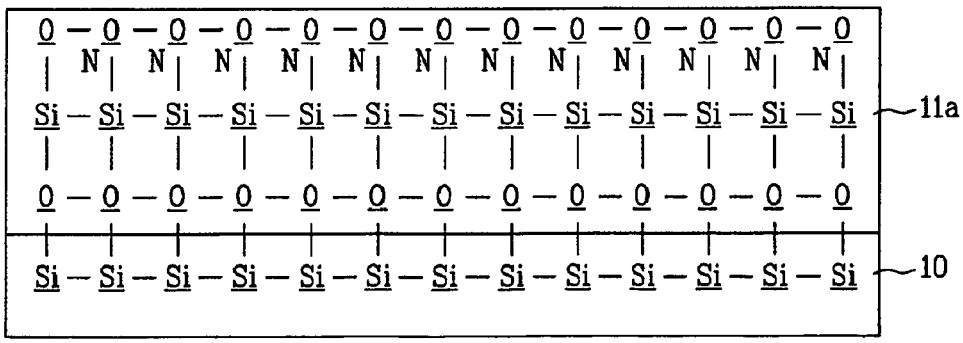
Figure 4:
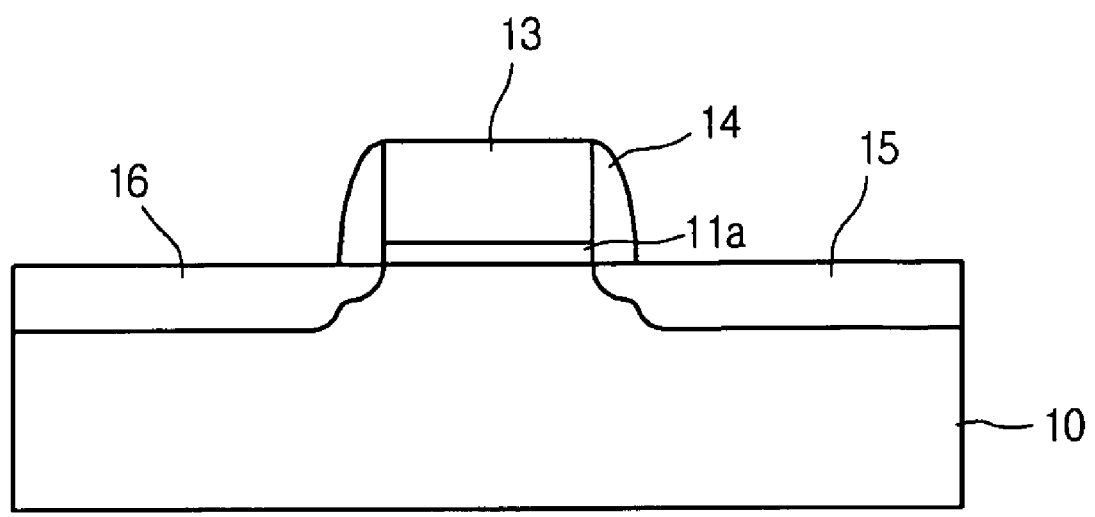
FIG. 4 is a cross-sectional view of the semiconductor device for illustrating the semiconductor device and a fabricating method thereof consistent with an embodiment of the present invention.

FIGS. 1 through 3 are cross-sectional views of a semiconductor device for illustrating a method of forming a gate of the semiconductor device consistent with an embodiment of the present invention. FIG. 4 is a cross-sectional view of the semiconductor device for illustrating the semiconductor device and a fabricating method thereof consistent with an embodiment of the present invention.

First, as shown in FIG. 1, in the method for fabricating the semiconductor device consistent with the present invention, a furnace deposits an insulating layer 11 formed of a silicon oxide film on a silicon substrate 10. Insulation film 11 may have a thickness of approximately 16 Å.

A process of forming insulation film 11 may use a water vapor generator (WVG) type wet oxidation process, and may be performed at a temperature ranging from about 740 to 760° C. and at a pressure ranging from about 90 to 110 torr for about 2 through 3 minutes. Also in the process, $N_2$ of 4.0~5.0 slm, $H_2$ of 0.4~0.6 slm, and $O_2$ of 0.4~0.6 slm are implanted in the insulation film 11.

Next, as shown in FIG. 2, nitrogen N ions are deposited on a surface of insulation film 11 as a mono-atomic layer using an Atomic Layer Deposition (ALD) process to form a nitrogen-atomic layer 12.

When ions to be subsequently doped at a gate electrode (for example, B+ ions when a gate electrode of PMOS is formed) are moved to a channel and cohere around a boundary of a gate insulation film, a threshold voltage Vth of a device shifts and the mobility of a carrier deteriorates. Nitrogen (N) ions are barrier ions, which prevents a threshold voltage Vth of a device from being shifted and the mobility of a carrier from being deteriorated.

Next, as shown in FIG. 3, nitrogen ions of nitrogen atomic-layer 12 penetrates into insulation film 11 by a rapid thermal anneal (RTA) process to stabilize nitrogen N ions on a surface of insulation film 11. Accordingly, a gate insulation film 11a is formed in where the nitrogen N ions are stabilized at a surface of gate insulating film 11a.

The RTA process may be performed at a temperature ranging from about 1050 to 1150° C. and at a pressure ranging from about 4 to 110 torr for about 10 through 20 seconds. Also in this process, $N_2$ of 4.0~5.5 slm is implanted in the gate insulation film 11a.

Subsequently, as shown in FIG. 4, after a deposition of a poly-silicon layer on gate insulation film 11a, gate insulation film 11a is photographic-etched in a photolithography process by using a gate formation mask to form a gate electrode 13.

Thereafter, impurity ions are implanted in gate electrode 13 to form an LDD region, and a spacer 14 is formed at a sidewall of the gate electrode 13. Further, high-density impurity ions are implanted to form a source region 16 and a drain region 15.

Through the aforementioned process, when a gate insulation film 11a of NO components is formed, a profile of N intensity may be stably formed at a surface of gate insulation film 11a. This can prevent deterioration of the mobility from occurring at a channel boundary due to nitrogen N ion distribution.

Furthermore, a plasma nitrification process is unnecessary. Accordingly, no damages occur during a plasma process, so that a gate electrode 13 includes an excellent NO components.

The method for fabricating the semiconductor device consistent with the present invention has following effects.

First, since nitrogen (N) ions may be stably distributed at a surface of a gate insulation film, a method consistent with the present invention can prevent deterioration of the mobility ions from occurring at a boundary of a channel due to nitrogen N ion distribution.

Second, because the plasma nitrification process is not necessary, damage of the gate insulation film is prevented.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor device, comprising:
    forming an insulating layer on a substrate;
    forming a mono-atomic layer of nitride film at the insulating layer;
    forming a gate insulating layer by an annealing process immediately after forming the mono-atomic layer of nitride film, wherein the mono-atomic layer of nitride film is penetrated into the insulating layer by the annealing process;
    forming a gate electrode on the gate insulating layer;
    forming a spacer at a sidewall of the gate electrode; and
    forming source/drain impurity regions at a side of the gate electrode.

2. The method according to claim 1, wherein the insulating layer comprises an oxide layer.

3. The method according to claim 1, wherein the formation of the insulating layer uses a water vapor generator (WVG) type wet oxidation process.

4. The method according to claim 1, wherein the formation of the insulating layer is performed at a temperature ranging from about 740 to 760° C. and at a pressure ranging from about 90 to 110 torr for about 2 through 3 minutes, in which $N_2$ of 4.0~5.0 slm, $H_2$ of 0.4~0.6 slm, and $O_2$ of 0.4~0.6 slm are implanted in the insulation film.

5. The method according to claim 1, wherein the mono-atomic layer of nitride film is formed by an atomic layer deposition (ALD) process.

6. The method according to claim 1, wherein the annealing process is achieved at a temperature ranging from about 1050 to 1150° C. and at a pressure ranging from about 4 to 110 torr for about 10 through 20 seconds.

* * * * *